(12) United States Patent  
Tago

(10) Patent No.: US 7,692,287 B2  
(45) Date of Patent: Apr. 6, 2010

(54) SEMICONDUCTOR DEVICE AND WIRING BOARD

(75) Inventor: Masamoto Tago, Tokyo (JP)

(73) Assignee: NEC Corporation, Tokyo (JP)

( * ) Notice: Subject to any disclaimer, the term of this patent is extended or adjusted under 35 U.S.C. 154(b) by 755 days.

(21) Appl. No.: 11/569,402

(22) PCT Filed: May 18, 2005

(86) PCT No.: PCT/JP2005/009062

§ 371 (c)(1), (2), (4) Date: Nov. 20, 2006

(87) PCT Pub. No.: WO2005/114729

PCT Pub. Date: Dec. 1, 2005

(65) Prior Publication Data

US 2008/0237890 A1  Oct. 2, 2008

(30) Foreign Application Priority Data

May 21, 2004  (JP) .............................. 2004-152629

(51) Int. Cl.  
*H01L 23/053* (2006.01)  
*H01L 23/48* (2006.01)  
(52) U.S. Cl. ................... 257/701; 257/778; 257/686; 257/703; 257/E23.145  
(58) Field of Classification Search ................ 257/701, 257/703, 778, 780, 686, E23.145  
See application file for complete search history.

(56) References Cited

U.S. PATENT DOCUMENTS

| | | | | |
|---|---|---|---|---|
| 5,258,648 A | * | 11/1993 | Lin ............................. | 257/778 |
| 5,790,384 A | * | 8/1998 | Ahmad et al. ................ | 361/760 |
| 5,814,894 A | * | 9/1998 | Igarashi et al. .............. | 257/787 |
| 5,870,289 A | * | 2/1999 | Tokuda et al. ............... | 361/779 |
| 6,175,160 B1 | * | 1/2001 | Paniccia et al. ............. | 257/778 |
| 6,380,621 B1 | * | 4/2002 | Ando et al. ................... | 257/707 |
| 6,472,735 B2 | * | 10/2002 | Isaak .......................... | 257/686 |
| 6,617,681 B1 | * | 9/2003 | Bohr .......................... | 257/700 |
| 6,900,534 B2 | * | 5/2005 | Murtuza ...................... | 257/707 |
| 7,045,886 B2 | * | 5/2006 | Sawada ....................... | 257/686 |
| 7,390,700 B2 | * | 6/2008 | Gerber et al. ............... | 438/108 |
| 2004/0173891 A1 | * | 9/2004 | Imai et al. .................... | 257/686 |

FOREIGN PATENT DOCUMENTS

| | | |
|---|---|---|
| JP | 64-32662 A | 2/1989 |
| JP | 3-105954 A | 5/1991 |
| JP | 8-167630 A | 6/1996 |
| JP | 8-330506 A | 12/1996 |
| JP | 2001-7248 A | 1/2001 |
| JP | 2001-196521 A | 7/2001 |
| JP | 2003-309209 A | 10/2003 |
| WO | WO 96/09645 A1 | 3/1996 |

\* cited by examiner

*Primary Examiner*—Nitin Parekh  
(74) *Attorney, Agent, or Firm*—Sughrue Mion, PLLC

(57) ABSTRACT

A wiring board (20A) includes a first wiring portion (10A) having a plurality of wiring layers (1) and external connecting bumps (5), and at least one second wiring portion (15A) having a plurality of contact plugs (14). The second wiring portion is integrated with the first wiring portion such that each terminal (14a) of the second wiring portion is in direct contact with one of the wiring layers of the first wiring portion. Hence, there is no risk to produce an internal stress caused by the diffused component of the solder bump in the junction portion between the second and first wiring portions. Accordingly, even when a semiconductor chip (30) of a low-k material is highly integrated on the wiring board, a highly reliable semiconductor device (50) can be obtained.

23 Claims, 9 Drawing Sheets

SEMICONDUCTOR DEVICE AND WIRING BOARD

TECHNICAL FIELD

The present invention relates to a semiconductor device and a wiring board and, more particularly, to a semiconductor device having a structure in which a semiconductor chip is mounted on a wiring board (to be simply referred to as "a semiconductor device" hereinafter), and the wiring board used in the semiconductor device.

BACKGROUND ART

To decrease the size and improve the performance of an electronic apparatus, the mounting density of a semiconductor chip or semiconductor device is being increased in recent years. The mounting density of a semiconductor chip is in many cases increased by mounting the semiconductor chip on a wiring board by wireless bonding, particularly, flip chip bonding. The mounting density of a semiconductor device is often increased by mounting the semiconductor device on a wiring board (which is different from a wiring board forming the semiconductor device. This wiring board will be referred to as "a mother board" hereinafter) by surface mounting. For semiconductor devices, various packaging methods suited to surface mounting such as a ball grid array semiconductor package have been developed. Flip chip bonding and surface mounting are advantageous in downsizing and micropatterning a semiconductor chip and semiconductor device, and increasing the number of pins. Flip chip bonding and surface mounting are also advantageous in increasing the operating speed of an integrated circuit or the like formed in a semiconductor chip, since the wiring resistance can be made lower than that of wiring bonding.

To improve the performance and increase the operating speed of, e.g., a system large-scale integrated circuit (system LSI), it is possible to improve the performance and increase the operating speed by mounting a plurality of LSIs and passive elements on one semiconductor chip, rather than by improving the performance and increasing the operating speed by one LSI. For this reason, a system LSI (system on chip) of this type is beginning to be widely used.

When forming a semiconductor device by mounting a highly integrated semiconductor chip having a large number of pins on a desired wiring board, a large difference between the thermal expansion coefficients of the semiconductor chip and wiring board increases the internal stress of the semiconductor device by heat generated when an electric current is supplied to the semiconductor chip. This causes stress concentration in, e.g., the junction portion between the semiconductor chip and wiring board in the semiconductor device or the connecting portion between the semiconductor device and a mother board, so disconnection or the like readily occurs. As a consequence, the reliability of the semiconductor device or an electronic apparatus using the semiconductor device decreases. To obtain a highly reliable semiconductor device or electronic apparatus, therefore, a resin is often filled in the junction portion between a semiconductor chip and wiring board of the semiconductor device, in the junction portion between the semiconductor device and a mother board, and in peripheral portions of these junction portions, thereby reinforcing the junction portions.

Japanese Patent Laid-Open No. 64-32662 (reference 1) describes a semiconductor package structure (semiconductor device) which increases the reliability by interposing, between a semiconductor chip and wiring board (large board), a small board having a specific thermal expansion coefficient, i.e., a small board whose thermal expansion coefficient difference from the semiconductor chip is smaller than that from the wiring board (large board). The semiconductor chip is mounted on the small board, and a plurality of small boards each having the semiconductor chip are mounted on the wiring board (large board) via a solder bump.

Although this is not an invention of a semiconductor device, Japanese Patent Laid-Open No. 8-167630 (reference 2) describes a chip connection structure in which an integrated circuit chip and wiring board are connected by direct through-hole connection by interposing an adhesive film between the integrated circuit chip and wiring board, and making the thermal expansion coefficient of the wiring board almost equal to that of the integrated circuit.

DISCLOSURE OF INVENTION

Problems to be Solved by the Invention

As described in reference 1, it is useful to interpose a small board having a specific thermal expansion coefficient between a wiring board (large board) and semiconductor chip, in order to suppress the internal stress of the semiconductor device.

However, assume that a small board is placed (mounted) on the wiring board (large board) via a solder bump to form the semiconductor device. In this case, the component of the solder bump may diffuse to a peripheral portion, thereby producing an internal stress by heat generated when the semiconductor device is driven or mounted on a mother board. Reference 1 describes bare chip mounting in which the space between the small board and semiconductor chip is not encapsulated with a resin. However, in consideration of mountability on the wiring board (large board), it is desirable to package the semiconductor chip.

Additionally, interposing only a specific small board makes it difficult to design the wiring board (large board) for a semiconductor chip which is micropatterned and given a large number of pins for improving the performance, and to mount the chip.

Today, in order to suppress an RC delay caused by increasing a wiring resistance (R) and inter-wiring capacitance (C) and increase the degree of integration, it is examined to use a low-k material such as a fluorine-doped silicon oxide or hydrogen-doped silicon oxide as the material of an interlayer dielectric film formed in the integrated circuit. Since such low-k material is more fragile than a conventional interlayer dielectric film (e.g., silicon oxide), the allowable limit of an internal stress is lower than that of the conventional material of the interlayer dielectric film. Additionally, in order to prevent ground water from being contaminated by lead, a tin-lead solder has been replaced with a tin-base lead-free solder. The stress relaxation effect of the tin-base lead-free solder is much smaller than that of the tin-lead solder.

Therefore, in consideration of a technical trend, it may be difficult to increase the reliability of the connection using the solder bump, and the reliability of the semiconductor device in the semiconductor device (semiconductor package structure) having the structure disclosed in reference 1.

The present invention has been made in consideration of the above situation, and has as its object to obtain a highly reliable semiconductor device even when elements are highly integrated on a semiconductor chip.

Means for Solving the Problems

In order to achieve the object, a semiconductor device of the present invention is characterized by comprising a wiring board comprising a plurality of connecting terminals arranged on one surface in a direction of thickness and a plurality of external connecting bumps arranged on the other surface in the direction of thickness, and a plurality of semiconductor chips connected to the connecting terminals on the wiring board by flip chip bonding, wherein the wiring board comprises a first wiring portion comprising a plurality of wiring layers and the external connecting bumps, and at least one second wiring portion integrated with the first wiring portion on the first wiring portion, the connecting terminals are made of contact plugs formed in through holes extending through the second wiring portion in the direction of thickness, one end of the contact plug is in direct contact with one of the wiring layers, a size of a surface of the second wiring portion on a side of the first wiring portion is smaller than a size of a surface of the first wiring portion on a side of the second wiring portion, and a thermal expansion coefficient of the second wiring portion is smaller than a thermal expansion coefficient of the first wiring portion and equal to a thermal expansion coefficient of the semiconductor chip.

Also, a wiring board of the present invention is characterized by comprising a first wiring portion comprising a plurality of wiring layers and a plurality of external connecting bumps, and at least one second wiring portion comprising a plurality of connecting terminals configured to mount a semiconductor chip by flip chip bonding, wherein the second wiring portion is integrated with the first wiring portion on the first wiring portion, the connecting terminals are made of contact plugs formed in through holes extending through the second wiring portion in the direction of thickness, one end of the contact plug is in direct contact with one of the wiring layers, a size of a surface of the second wiring portion on a side of the first wiring portion is smaller than a size of a surface of the first wiring portion on a side of the second wiring portion, and a thermal expansion coefficient of the second wiring portion is smaller than a thermal expansion coefficient of the first wiring portion and equal to a thermal expansion coefficient of the semiconductor chip.

EFFECTS OF THE INVENTION

According to the present invention, a highly reliable semiconductor device can be obtained even when elements are highly integrated on a semiconductor chip. Additionally, the reliability of an electronic apparatus in which the semiconductor device is mounted on a mother board can increase.

A first wiring portion of the present invention makes it possible to extend a terminal pitch, and reduce a load to lay out interconnections in the wiring board. Accordingly, it is possible to readily mount a package while implementing a highly integrated semiconductor chip as a package, and to reduce a cost.

BEST MODE FOR CARRYING OUT THE INVENTION

Embodiments of a semiconductor device and a wiring board of the present invention will be explained in detail below with reference to the accompanying drawings.

Semiconductor Device and Wiring Board

First Embodiments

Figure 1:
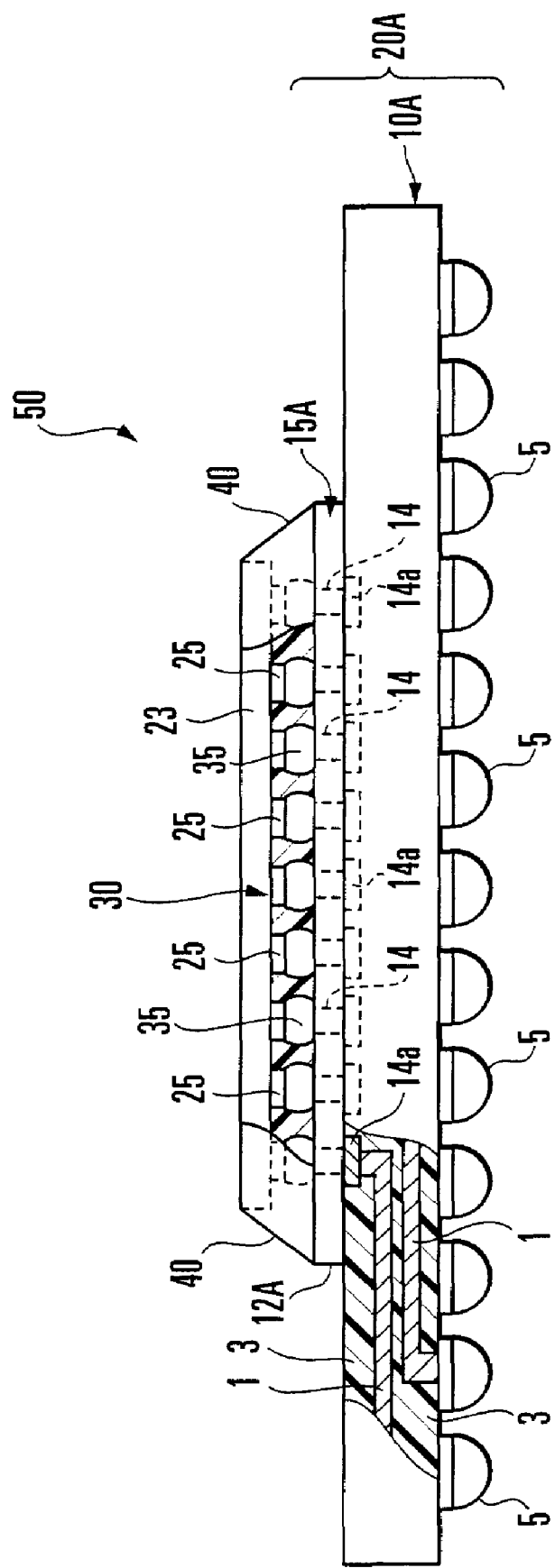
FIG. 1 is a partially cutaway side view schematically showing the first embodiments of a semiconductor device and wiring board of the present invention.

In a semiconductor device 50 shown in FIG. 1, a plurality of semiconductor chips 30 are mounted on a wiring board 20A by flip chip bonding. However, FIG. 1 shows only one semiconductor chip 30. A plurality of connecting terminals 14 are arranged on one surface of the wiring board 20A in the direction of thickness, and a plurality of external connecting bumps 5 are arranged on the other surface in the direction of thickness.

The wiring board 20A comprises a first wiring portion 10A, and one or more second wiring portions electrically connected to the first wiring portion 10A and integrated with the first wiring portion 10A on the first wiring portion 10A. However, FIG. 1 shows only one second wiring portion 15A.

A plurality of wiring layers 1 (two layers in the example shown in FIG. 1) are formed in the first wiring portion 10A, and interlayer dielectric films 3 are formed around the wiring layers 1. Also, the plurality of external connecting bumps 5 are formed on one surface in the direction of thickness of the first wiring portion 10A, such that each external connecting bump 5 electrically connects to a predetermined wiring layer 1.

On the other hand, the second wiring portion 15A has a base 12A, and the connecting terminals 14 which extend through the base 12A in the direction of thickness. When mounting one semiconductor chip 30 on one second wiring portion 15A, the number of connecting terminals 14 can be equal to that of electrode terminals 25 formed in the semiconductor chip 30. When mounting the plurality of semiconductor chips 30 on one second wiring portion 15A, the number of connecting terminals 14 can be equal to the total sum of the electrode terminals 25 formed in the semiconductor chips 30. Each connecting terminal 14 is made of a contact plug (to be referred to as "a contact plug 14" hereinafter) formed in a through hole which extends through the second wiring portion 15A (base 12A) in the direction of thickness. Each contact plug 14 has a thin land portion 14a at one end on the first wiring portion 10A side. Note that the "land" means one region of a conductor, in which the conductor connects to another conductor.

The second wiring portion 15A is integrated with the first wiring portion 10A, such that each land portion 14a of the contact plug 14 is in direct contact with a predetermined wiring layer 1. The planar size of the second wiring portion 15A is larger than that of the semiconductor chip 30 mounted on the second wiring portion 15A. That is, the size of the surface of the second wiring portion 15A on which the semiconductor chip 30 is mounted is larger than that of the surface of the semiconductor chip 30 which opposes the surface of the second wiring portion 15A. When viewed from above, the second wiring portion 15A is 1 mm or more all around larger than the semiconductor chip 30 mounted on the second wiring portion 15A. However, the planar size of the second wiring portion 15A is smaller than that of the first wiring portion 10A. That is, the size of the surface of the second wiring portion 15A on the first wiring portion 10A side is smaller than that of the surface of the first wiring portion 10A on the second wiring portion 15A side.

The material of the base 12A is selected so that the thermal expansion coefficient of the second wiring portion 15A is smaller than that of the first wiring portion 10A, and equal to that of each semiconductor chip 30. When each semiconductor chip 30 is a silicon chip, for example, silicon, ceramics, or photosensitive glass can be used as the material of the base 12A. These materials facilitate making the thermal expansion coefficient of the second wiring portion 15A equal to that of the semiconductor chip 30. Another second wiring portion (not shown in FIG. 1) also has the same arrangement as the above-described second wiring portion 15A.

"The thermal expansion coefficient of the second wiring portion 15A is smaller than that of the first wiring portion 10A" means that the thermal expansion coefficient of the whole second wiring portion 15A is smaller than that of the whole first wiring portion 10A. Also, "the thermal expansion coefficient of the second wiring portion 15A is equal to that of the semiconductor chip 30" means that the difference between the thermal expansion coefficient of the whole second wiring portion 15A and that of the whole semiconductor chip 30 is about 10 ppm/° C. or less.

Each semiconductor chip 30 is obtained by forming an integrated circuit such as an LSI on, e.g., a silicon board 23, and an internal connecting bump 35 connects each electrode terminal 25 formed in the semiconductor chip 30 to a predetermined contact plug 14. If necessary, as shown in FIG. 1, the junction portion between the semiconductor chip 30 and second wiring portion 15A can be reinforced by filling a resin 40 in the space between the semiconductor chip 30 and second wiring portion 15A and in the periphery of the space. As the resin 40, it is favorable to appropriately select, e.g., an epoxy resin which produces no excess stress in the junction portion between the semiconductor chip 30 and second wiring portion 15A. It is also possible to encapsulate only the periphery of the semiconductor chip 30 with the resin 40. Since the planar size of the second wiring portion 15A is larger than that of the semiconductor chip 30, the resin 40 can be readily prevented from bleeding out onto the first wiring portion 10A.

In the semiconductor device 50 having the above-described structure, the second wiring portion 15A is integrated with the first wiring portion 10A such that each land portion 14a of the contact plug 14 is in direct contact with a predetermined wiring layer 1. Accordingly, there is no risk to produce the internal stress caused by the diffused component of the solder bump in the junction portion between the second wiring portion 15A and first wiring portion 10A. Additionally, the relationship among the thermal expansion coefficients of the second wiring portion 15A, semiconductor chip 30, and first wiring portion 10A is as described above. Accordingly, it is possible to suppress the internal stress caused by the thermal expansion coefficient difference between the semiconductor chip 33 and wiring board 20A. It is also possible to relax the internal stress caused by the thermal expansion coefficient difference between the semiconductor chip 30 and mother board when the semiconductor device 50 is surface-mounted on the mother board. Hence, even when the low-k film serves as the interlayer dielectric film in the integrated circuit, it is possible to suppress damage or degradation of the function of the interlayer dielectric film caused by the internal stress. Furthermore, the relationship between the thermal expansion coefficients of the semiconductor chip 30 and second wiring portion 15A is as described above even when the semiconductor chip 30 connects to the second wiring portion 15A using the lead-free solder. Hence, it is possible to suppress the internal stress caused by the thermal expansion coefficient difference between the semiconductor chip 30 and second wiring portion 15A.

Accordingly, it is readily possible not only to improve the performance but also to increase the reliability of the semiconductor device 50. Also, a high-reliability, high-performance electronic apparatus is readily obtained by mounting the semiconductor device 50 on a mother board.

Semiconductor Device and Wiring Board

Second Embodiments

Figure 2:
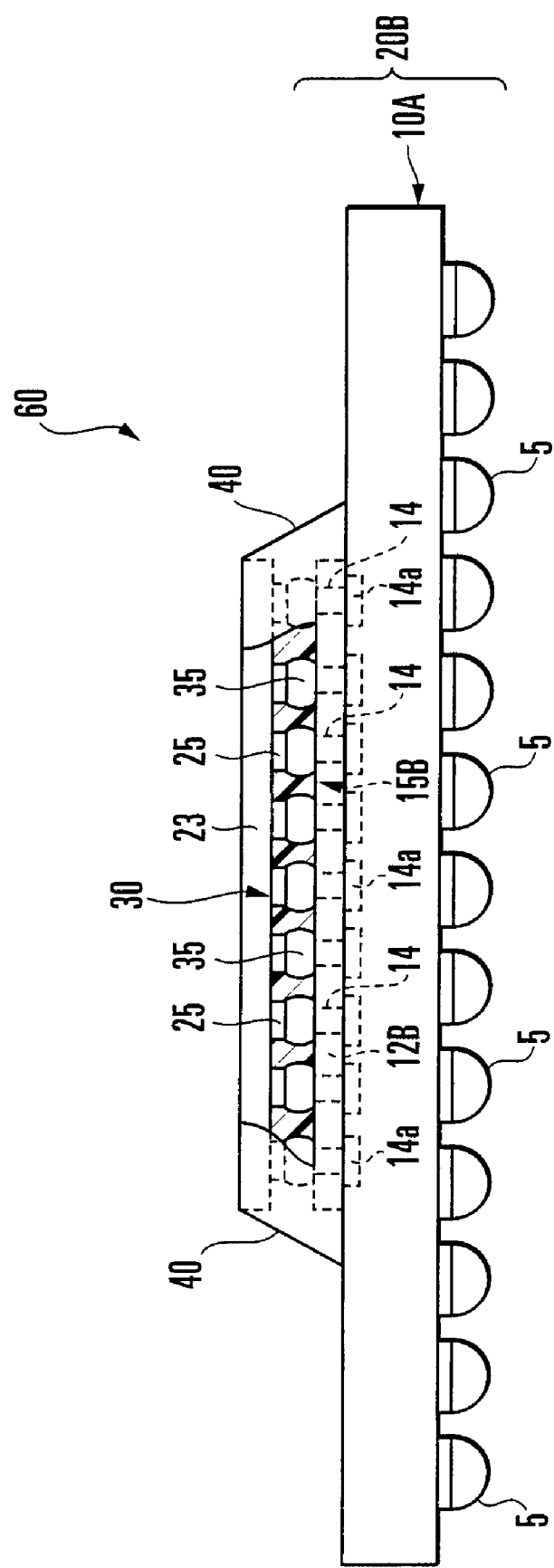
FIG. 2 is a side view schematically showing the second embodiments of the semiconductor device and wiring board of the present invention.

In a semiconductor device 60 shown in FIG. 2, the planar size of each second wiring portion 15B is equal to that of a semiconductor chip 30 mounted on the second wiring portion 15B. That is, the size of the surface of the second wiring portion 15B on which the semiconductor chip 30 is mounted is equal to that of the surface of the semiconductor chip 30 which opposes the surface of the second wiring portion 15B. Except for that, the semiconductor device 60 has the same structure as the semiconductor device 50 of the first embodiment shown in FIG. 1. Note that the same reference numerals in FIG. 2 denote the same constituent members as those in FIG. 1, and a description thereof will be omitted. Reference numeral "12B" in FIG. 2 denotes a base which forms the second wiring portion 15B, and reference numeral "20B" denotes a wiring board having the second wiring portion 15B.

The semiconductor device 60 achieves the same technical effect as the semiconductor device 50 in the first embodiment. Note that the planar size of the second wiring portion 15B is equal to that of the semiconductor chip 30 mounted on the second wiring portion 15B. Hence, as shown in FIG. 2, a resin 40 is spread on a first wiring portion 10A when filling the resin 40 in the space between the semiconductor chip 30 and second wiring portion 15B and in the periphery of the space. Similarly, the resin 40 is also spread on the first wiring portion 10A when encapsulating only the periphery of the semiconductor chip 30 with the resin 40. When an interlayer dielectric film 3 (see FIG. 1) is formed with the resin in the first wiring portion 10A, the resin 40 can be prevented from bleeding using the difference in wettability between the resins 40 on the second wiring portion 15B and in the first wiring portion 10A (interlayer dielectric film 3).

Semiconductor Device and Wiring Board

Third Embodiment

Figure 3:
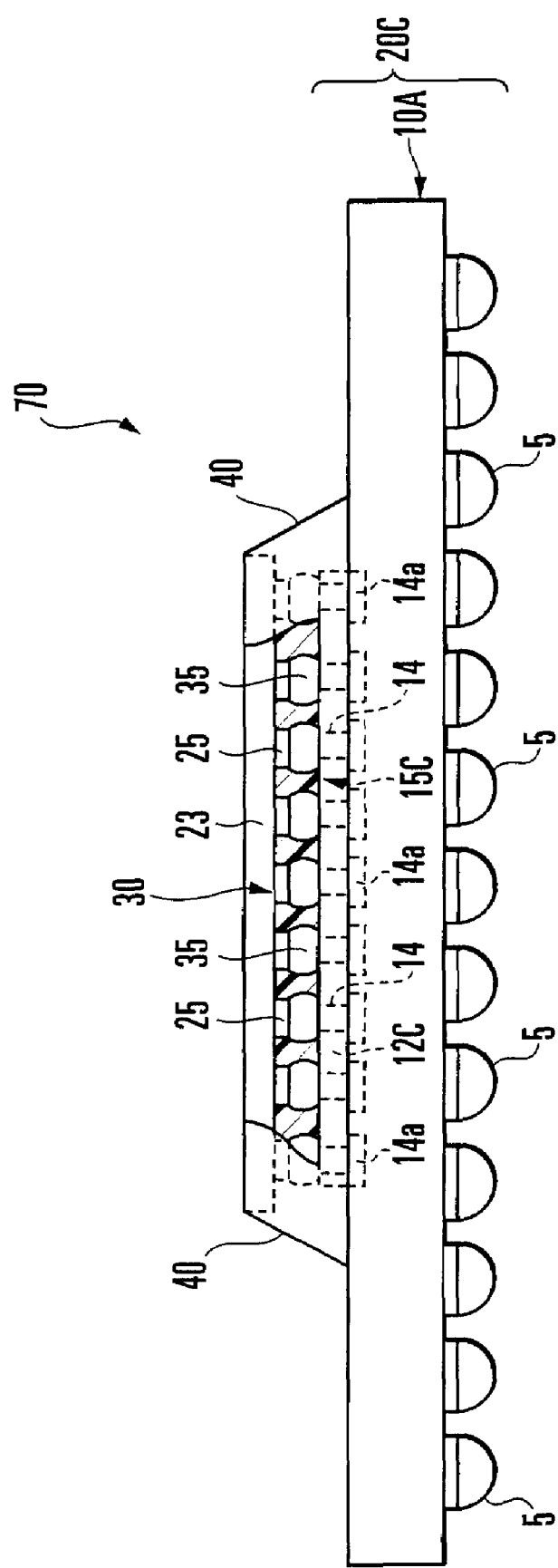
FIG. 3 is a side view schematically showing the third embodiments of the semiconductor device and wiring board of the present invention.

In a semiconductor device 70 shown in FIG. 3, the planar size of each second wiring portion 15C is smaller than that of a semiconductor chip 30 mounted on the second wiring portion 15C. That is, the size of the surface of the second wiring portion 15C on which the semiconductor chip 30 is mounted is smaller than that of the surface of the semiconductor chip 30 which opposes the surface of the second wiring portion 15C. Except for that, the semiconductor device 70 has the same structure as the semiconductor device 50 of the first embodiment shown in FIG. 1. Note that the same reference numerals in FIG. 3 denote the same constituent members as those in FIG. 1, and a description thereof will be omitted. Reference numeral "12C" in FIG. 3 denotes a base which forms the second wiring portion 15C, and reference numeral "20C" denotes a wiring board having the second wiring portion 15C. The semiconductor device 70 achieves the same technical effect as the semiconductor device 60 in the second embodiment shown in FIG. 2.

Semiconductor Device and Wiring Board

Fourth Embodiment

Figure 4:
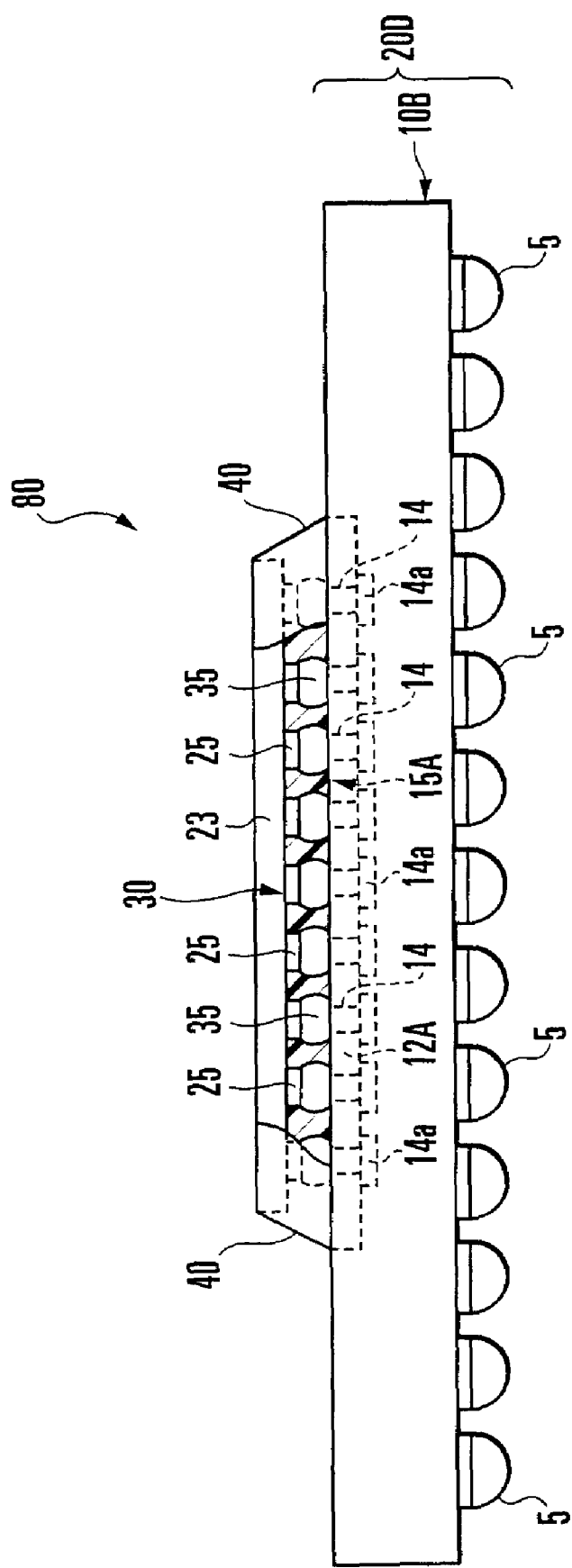
FIG. 4 is a side view schematically showing the fourth embodiments of the semiconductor device and wiring board of the present invention.

In a semiconductor device 80 shown in FIG. 4, each second wiring portion 15A is buried in a first wiring portion 10B, such that each upper end (which is the other end of a land portion 14a, and is in direct contact with the semiconductor chip 30) of a contact plug 14 is exposed. Except for that, the semiconductor device 80 has the same structure as the semiconductor device 50 of the first embodiment shown in FIG. 1. Note that the same reference numerals in FIG. 4 denote the same constituent members as those in FIG. 1, and a description thereof will be omitted.

The thickness of an interlayer dielectric film (not shown) in the first wiring portion 10B on the second wiring portion 15A side is larger than that of the interlayer dielectric film 3 in the first wiring portion 10A shown in FIG. 1. The second wiring portion 15A is buried in this interlayer dielectric film.

In the semiconductor device 80 having such structure, the interlayer dielectric film can restrict the second wiring portion 15A from its side surface when the interlayer dielectric film in the first wiring portion 10B is formed by a resin. The interlayer dielectric film which restricts the second wiring portion 15A from its side surface can prevent a crack caused by thermal expansion or thermal shrinkage in an electrically connecting portion between the first wiring portion 10B and second wiring portion 15A, or suppress damage to the connecting portion caused by growing the generated crack can be suppressed.

Accordingly, it is readily possible not only to improve the performance but also to increase the reliability of the semiconductor device 80 in comparison with the semiconductor device of the first to third embodiments. Also, a high-reliability electronic apparatus is readily obtained by mounting the semiconductor device 80 on a mother board.

Although not shown in FIG. 4, a semiconductor device can achieve the same technical effect as the semiconductor device 80 by using the second wiring portion 15B or 15C shown in FIG. 2 or 3 in place of the second wiring portion 15A.

Semiconductor Device and Wiring Board

Fifth Embodiment

Figure 5:
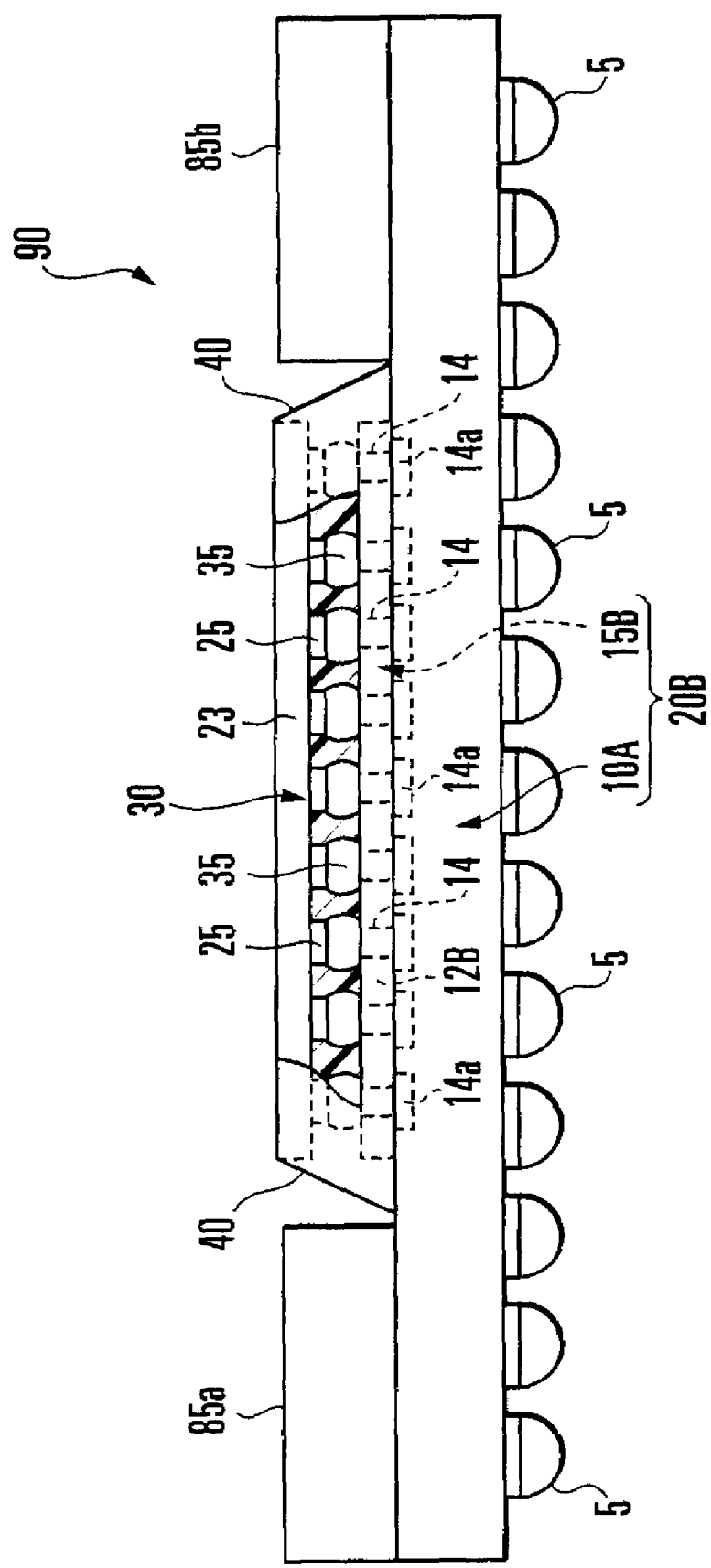
FIG. 5 is a side view schematically showing the fifth embodiments of the semiconductor device and wiring board of the present invention.

In a semiconductor device 90 shown in FIG. 5, two reinforcing frame members (stiffeners) 85a and 85b are bonded on a region adjacent to the semiconductor chip 30 on the wiring board 20B in the semiconductor device 60 of the second embodiment shown in FIG. 2. More particularly, the reinforcing frame members 85a and 85b are arranged around a second wiring portion 15B on a first wiring portion 10A of the wiring board 20B. Note that the same reference numerals in FIG. 5 denote the same constituent members as those in FIG. 2, and a description thereof will be omitted.

It is desirable to thin a base 12B in the second wiring portion 15B in order to accurately form contact plugs 14 in the second wiring portion 15B and thin the semiconductor device 90. However, the thin base 12B readily causes thermal deformation of the second wiring portion 15B, thereby causing large thermal deformation of the area of the wiring board 20B (without reinforcing frame members 85a and 85b) on which the second wiring portion 15B is mounted.

In the semiconductor device 90 shown in FIG. 5, the reinforcing frame members 85a and 85b are bonded on the first wiring portion 10A. Accordingly, it is readily possible not only to suppress thermal deformation even when thinning the second wiring portion 15B but also to obtain the highly reliable semiconductor device 90 while maintaining mountability of the semiconductor chip 30. As the reinforcing frame members 85a and 85b, it is preferable to use a material whose thermal expansion coefficient is equal to or smaller than that of the semiconductor chip 30 (the thermal expansion coefficient may be almost equal to that of the semiconductor chip 30) in order to suppress the internal stress of the semiconductor device 90. The reinforcing frame members 85a and 85b can be bonded on the first wiring portion 10A using, e.g., a bonding agent with high thermal conductivity.

As described above, in the semiconductor device 90 according to this embodiment, it is readily possible to suppress thermal deformation of the wiring board 20B even when thinning the second wiring portion 15B. Accordingly, it is readily possible not only to improve the performance but also to increase the reliability of the semiconductor device 90. The semiconductor device 90 is readily thinned. Also, a high-reliability, high-performance electronic apparatus is readily obtained by mounting the semiconductor device 90 on a mother board.

Although not shown in FIG. 5, the reinforcing frame members can be arranged in the semiconductor device 50 of the first embodiment shown in FIG. 1, the semiconductor device 70 of the third embodiment shown in FIG. 3, or the semiconductor device 80 of the fourth embodiment shown in FIG. 4.

Semiconductor Device and Wiring Board

Sixth Embodiment

Figure 6:
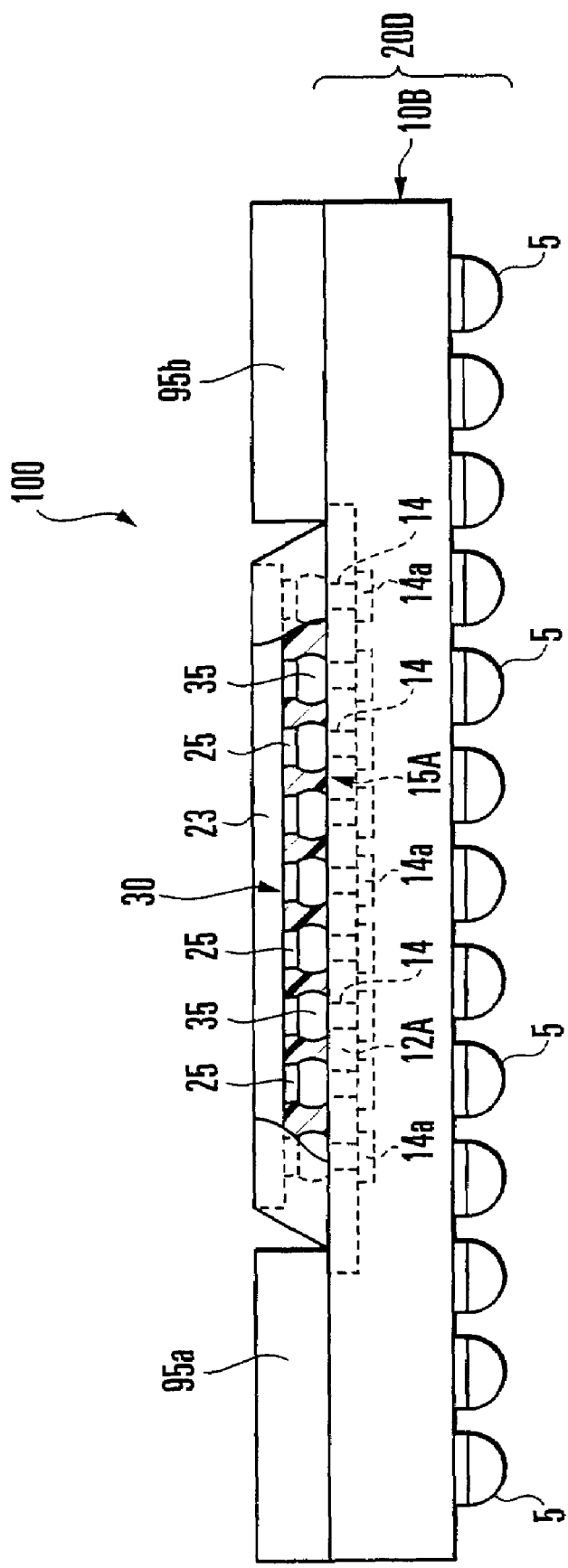
FIG. 6 is a side view schematically showing the sixth embodiments of the semiconductor device and wiring board of the present invention.

A semiconductor device 100 shown in FIG. 6 has a specific structure including two reinforcing frame members (stiffeners) 95a and 95b on the wiring board 20D in the semiconductor device 80 of the fourth embodiment shown in FIG. 4, i.e., a structure in which each of the reinforcing frame members 95a and 95b partially covers a first and second wiring portions 10B and 15A, and is bonded with them. Note that the same reference numerals in FIG. 6 denote the same constituent members as those in FIG. 4, and a description thereof will be omitted.

Since each of the reinforcing frame members 95a and 95b partially covers the first and second wiring portions 10B and 15A, the semiconductor device 100 suppresses thermal deformation of the wiring board 20D more readily than the above-described semiconductor device 90 of the above-described fifth embodiment.

It is readily possible not only to improve the performance but also to increase the reliability of the semiconductor device 100. Also, the semiconductor device 100 is readily thinned. A high-reliability, high-performance electronic apparatus is readily obtained by mounting the semiconductor device 100 on a mother board.

Although not shown in FIG. 6, when the shapes of the reinforcing frame members are appropriately selected, the reinforcing frame members of the sixth embodiment can be arranged in the semiconductor device 50 of the first embodiment shown in FIG. 1, the semiconductor device 60 of the second embodiment shown in FIG. 2, or the semiconductor device 70 of the third embodiment shown in FIG. 3.

Semiconductor Device and Wiring Board

Seventh Embodiment

Figure 7:
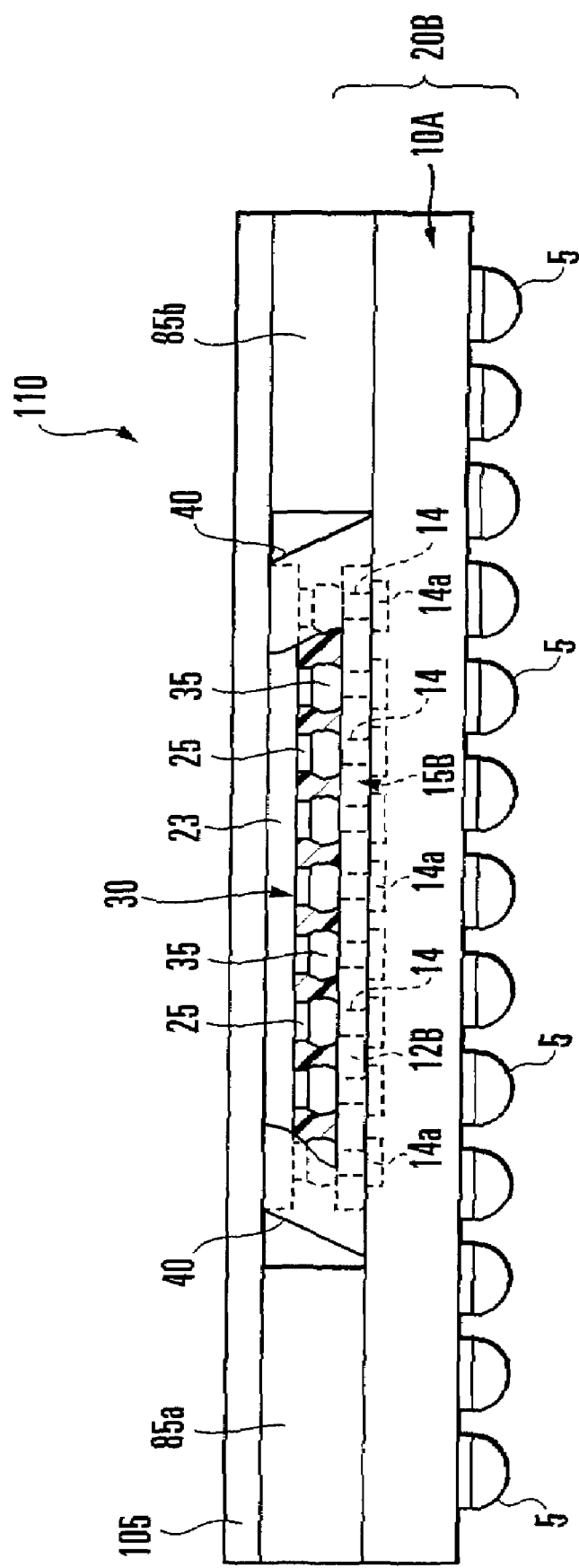
FIG. 7 is a side view schematically showing the seventh embodiments of the semiconductor device and wiring board of the present invention.

A semiconductor device 110 shown in FIG. 7 has a heat sink 105 on the semiconductor device 90 of the fifth embodiment shown in FIG. 5. The heat sink 105 bridges between two reinforcing frame members 85a and 85b such that the heat sink 105 covers the two reinforcing frame members 85a and 85b and surface-contacted to a semiconductor chip 30. Note that the same reference numerals in FIG. 7 denote the same constituent members as those in FIG. 5, and a description thereof will be omitted.

The heat sink 105 shown in FIG. 7 allows heat generated when an electric current is supplied to the semiconductor chip 30 to dissipate efficiently. Hence, it is readily possible to suppress thermal deformation of a wiring board 20B, and to suppress the internal stress of the semiconductor device 110. Also, it is also possible to suppress degradation of the performance of the semiconductor chip 30 caused by heat.

It is readily possible not only to improve the performance but also to increase the reliability of the semiconductor device 100. Also, the semiconductor device 100 is readily thinned. A high-reliability, high-performance electronic apparatus is readily obtained by mounting the semiconductor device 100 on a mother board. Note that the heat sink can be appropriately arranged in the semiconductor devices of the other embodiments.

Semiconductor Device and Wiring Board

Eighth Embodiment

Figure 8:
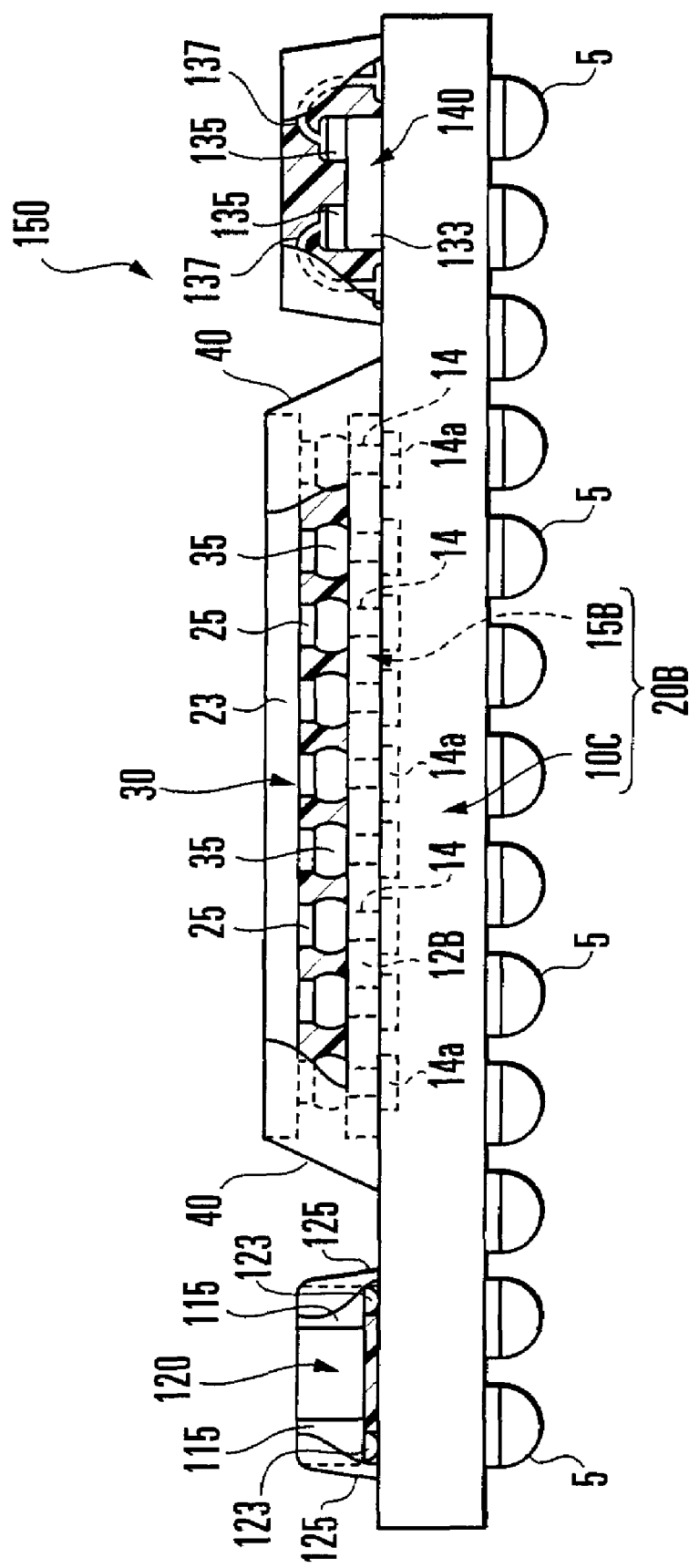
FIG. 8 is a side view schematically showing the eighth embodiments of the semiconductor device and wiring board of the present invention.

In a semiconductor device 150 shown in FIG. 8, (1) a passive element 120 and second semiconductor chip 130 are further included, and (2) circuits respectively corresponding to the passive element 120 and second semiconductor chip 130 are formed in a first wiring portion 10C. The semiconductor device 150 is different from the semiconductor device 60 shown in FIG. 2 only in these respects. Except for that, the structure of the semiconductor device 150 is almost the same as that of the semiconductor device 60. The same reference numerals in FIG. 8 denote the same constituent members as those in FIG. 2, and a description thereof will be omitted.

The passive element 120 is, e.g., a resistor, capacitor, or coil, and each electrode terminal 115 formed in the passive element 120 connects to a predetermined land (not shown) in the first wiring portion 10C via a solder bump 123. If necessary, as shown in FIG. 8, the junction portion between the passive element 120 and first wiring portion 10C can be reinforced by filling a resin 125 in the space between the passive element 120 and first wiring portion 10C and in the periphery of the space.

The second semiconductor chip 140 is obtained by forming an integrated circuit on, e.g., a silicon board 133. Each electrode terminal 135 formed on the second semiconductor chip 140 connects to a predetermined land (not shown) in the first wiring portion 10C by using thin metal wire 137 without using any solder bumps.

The semiconductor device 150 having such structure achieves the same technical effect as the semiconductor device 60 shown in FIG. 2. The semiconductor device 150 includes the passive element 120 and second semiconductor chip 140 in addition to a plurality of semiconductor chips 30, thereby improving the performance.

<Semiconductor Device (Modification)>

In the above-described semiconductor device, a plurality of semiconductor chips need be formed on the above-described wiring board by flip chip bonding. One or more semiconductor chips can be mounted on one second wiring portion by flip chip bonding. It is possible to appropriately select whether to mount an element other than the plurality of semiconductor chips on the wiring board. When mounting an element other than the plurality of semiconductor chips on the wiring board, this element to be mounted is appropriately selected in accordance with, e.g., the function and performance of the semiconductor device to be manufactured.

When mounting an element other than the plurality of semiconductor chips on the wiring board, the mounting form of the element which generates a small heat amount can be either wireless bonding or wire bonding. The mounting form of the element which generates a large heat amount is preferably wire bonding.

<Wiring Board (Modification)>

When an interlayer dielectric film in the first wiring portion is made of, e.g., a resin, the first and second wiring portions can be integrated by separately forming the first and second wiring portions, softening a predetermined interlayer dielectric film of the first wiring portion, and fixing them by heat seal. However, the first and second wiring portions are preferably integrated by forming the first wiring portion on a predetermined surface of the second wiring portion of its base by a so-called buildup method. After forming the first wiring portion on a predetermined surface of the base of the second wiring portion by the buildup method, a contact plug is formed on the base to obtain the second wiring portion.

Figure 9:
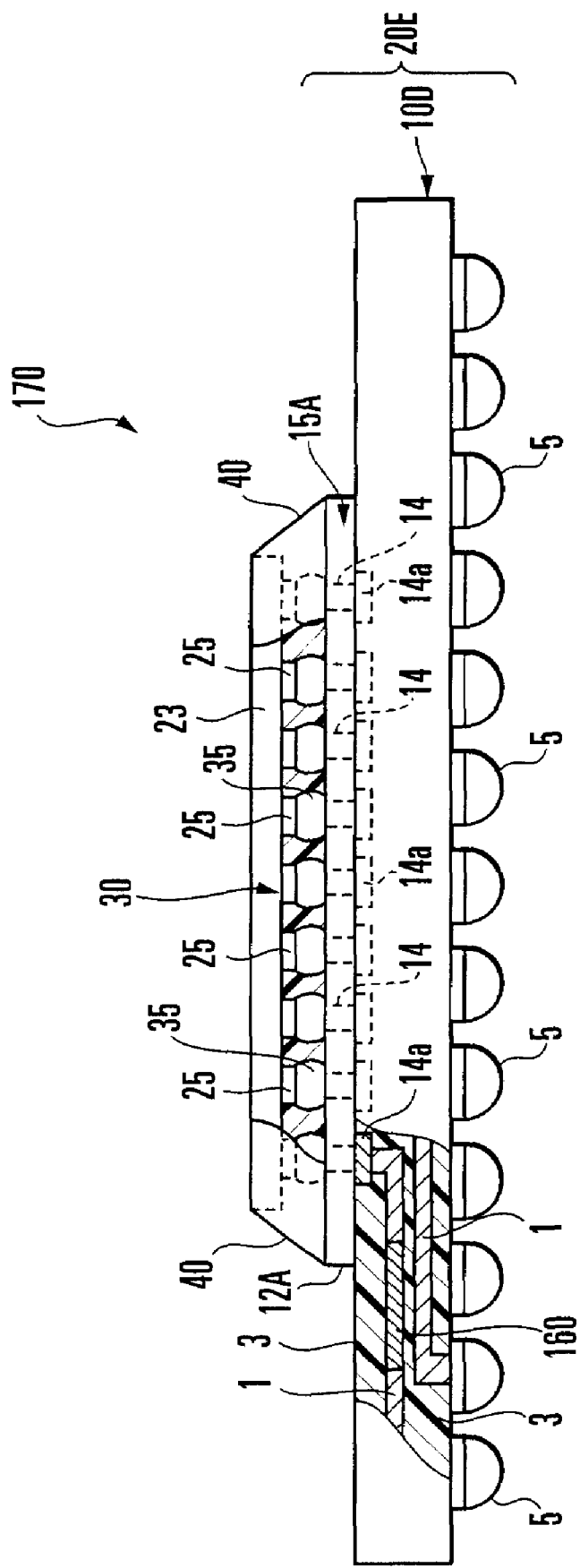
FIG. 9 is a side view schematically showing modifications of the semiconductor device and wiring board of the present invention.

As shown in FIG. 9, at least one functional element 160 can be formed, if necessary, in a first wiring portion 10D. Examples of the functional element 160 are a capacitor, decoupling capacitor, resistor, and inductor. A similar functional element can also be formed on the surface of the second wiring portion on the first wiring portion side. In FIG. 9, reference numeral "20E" denotes a wiring board having the first wiring portion 10D, and reference numeral "170" denotes a semiconductor device having the wiring board 20E.

The number of contact plugs formed in the second wiring portion can be appropriately selected by taking account of the total sum of electrode terminals in the semiconductor chip to be mounted on the second wiring portion, and the total sum of electrode terminals in an element to be mounted in addition to the semiconductor chip.

For at least the semiconductor chip to be mounted on the second wiring portion by flip chip bonding, contact plugs are preferably formed in the second wiring portion such that the electrode terminals formed in the semiconductor chip electrically connect to the respective contact plugs. The reason will be described hereinafter.

In the above-described embodiments, the second wiring portion serving as a relaxation layer is added to relax the internal stress. In this case, the formation of contact plugs as described above obviates the need to lay out interconnections in the second wiring portion for the semiconductor chip, so the internal stress can be readily suppressed while the designed characteristics of each semiconductor chip or characteristics close to the design values of the semiconductor chip are maintained.

When forming the functional element such as a decoupling capacitor, this functional element is desirably placed in a position as close as possible to the electrode of the semiconductor chip. The functional element can be placed in a position close to the electrode of the semiconductor chip if no interconnections need be formed in the second wiring portion.

The shape of each contact plug in the second wiring portion can be a shape having no land portion at the end portion in the longitudinal direction, or a shape having a land portion at one or both of the two ends in the longitudinal direction. Whether to form a land portion in the contact plug can be appropriately selected.

Examples of methods of forming the first and second wiring portions will be described below by exemplifying silicon used as the base material of the second wiring portion.

(Method of Forming First Wiring Portion)

The first wiring portion is preferably formed, by a buildup method, on a predetermined surface of the second wiring portion, a predetermined surface of the base of the second wiring portion in which a through hole for forming a contact plug is formed, or a desired surface of the base of the second wiring portion in which no through hole is formed. This buildup method repetitively performs, e.g., (1) a first substep of forming an electrical insulating film serving as an interlayer dielectric film, (2) a second substep of forming a predetermined number of via holes in the electrical insulating film, and performing a desmear process if necessary when the via holes are formed by laser processing, (3) a third substep of forming a conductive film serving as a wiring layer, and (4) a fourth substep of forming a wiring layer by patterning the conductive film a desired number of times in the order named, covers regions except for a desired region in the uppermost wiring layer, i.e., a region to be used as a land portion with a solder resist such as polyimide, and forms an external connecting bump on the region, thereby obtaining the first wiring portion. Note that the external connecting bump can be formed after forming the first wiring portion without the external connecting bump, and forming the second wiring portion.

(Method of Forming Second Wiring Portion)

The second wiring portion is formed by performing (a) a first substep of forming a recess in the base material of the base of the second wiring portion, (b) a second substep of filling the recess with a conductive material, and (c) a third substep of thinning the base material to expose the conductive material filled in the recess in the order named. After the third substep, if necessary, the planar shape of the base material thinned in the third substep can be patterned to form a desired shape.

In the first substep (a), an electrical insulating layer is first formed on a desired surface of the base material by using, e.g., silicon oxide, silicon nitride, silicon carbide, fluorine-doped silicon oxide, or silicon oxycarbide, and patterned by lithography to form holes in predetermined portions, and etched to a desired depth from these holes by reactive ion etching (RIE) after that. In this manner, the recesses can be formed in the predetermined portions of the base material. The thickness of the base material can be appropriately selected from the range of, e.g., about 100 to 750 µm. The depth of the recess can be appropriately selected from the range of, e.g., about 50 to 500 µm. Also, when the horizontal sectional shape of the recess is a circle, the diameter of the circle can be appropriately selected from the range of, e.g., about 10 to 150 µm.

In the second substep (b), an electrical insulating film is formed on the inner surface of the recess and on the surface of the electrical insulating layer by depositing silicon oxide by, e.g., plasma CVD using TEOS ($Si(OC_2H_5)_4$) gas as one source gas, and copper is deposited on this electrical insulating film by, e.g., sputtering. Plasma CVD using TEOS ($Si(OC_2H_5)_4$) gas as one source gas can form an electrical insulating film with high step coverage, so a desired electrical insulating film can be easily formed even when the recess is deep. Also, copper deposited on the electrical insulating film functions as a seed when performing copper plating by the damascene method (a kind of plating).

Copper plating is then performed by the damascene method to fill the recess with a copper plating layer, the copper plating layer formed by the damascene method is planarized by chemical mechanical polishing (CMP), and unnecessary portions of the copper plating layer are removed by etching, thereby leaving a copper plating layer behind in and around the recess. A copper plating layer left behind around the recess functions as a land portion of a contact plug (to be described later). The recess can also be filled by depositing a conductive material by chemical vapor deposition (CVD), instead of copper plating by the damascene method. It is also possible to use a metal material other than copper or a conductive resin as the conductive material.

If necessary, a functional element such as a capacitor, resistor, or inductor can be formed on one surface (a surface in which the recess is formed) in the direction of thickness of the base material by a thin-film process. Since the base material is made of silicon, the functional element can be accurately formed by using various semiconductor diffusion processes. It is also possible to readily reduce the cost such as the installation cost.

In the third substep (c), the base material having undergone the second substep is thinned to a desired thickness by mechanical polishing and further thinned by RIE from the other surface in the direction of thickness of the base material, thereby exposing the layer (formed by depositing copper by spattering on the electrical insulating film formed by plasma CVD) formed on the bottom surface of the recess. After that, the base material is further polished by CMP until the copper plating layer formed in the recess 5 is exposed. In this manner, the second wiring portion can be obtained. The exposed copper plating layer functions as a contact plug.

A strained layer is normally formed on the mechanically polished surface, and this may produce microcracks and decrease the reliability depending on the conditions, so it is necessary to well take account of the conditions such as the amount removed by mechanical polishing and the cutting speed. Also, thinning can be exclusively performed by mechanical polishing as long as the reliability is not influenced.

Except for the above-described methods, the second wiring portion can be obtained by forming a through hole extending through the base of the second wiring portion by etching, burying the material in the through hole by depositing the conductive material in the through hole by plating or CVD, and then planarizing the surface of the deposited conductive material.

If necessary, a land portion can be formed on the contact plug in the fourth substep. In the fourth substep, first, a first electrical insulating film is formed on the second wiring portion by silicon oxide or the like, and patterned by photolithography to form a hole on the contact plug. Then, a conductive film having a desired shape is formed to fill the hole, a protective film covering the conductive film is formed by, e.g., silicon oxide, silicon nitride, silicon carbide, fluorine-doped silicon oxide, or silicon oxycarbide, and that region of the protective film which is positioned above the contact plug is removed to form a hole. That region of the conductive film which is exposed in the hole functions as a land portion described above.

The above-described wiring board can be obtained by forming the first and second wiring portions based on the above-described methods of forming the first and second wiring portions. In this case, when the order of steps in the methods of forming the first and second wiring portions is given as described above, for example, the first wiring portion can be formed while forming the second wiring portion.

The wiring boards 20A to 20C shown in FIGS. 1 to 3 can be manufactured by the following procedures. For example, the base material of the base of the second wiring portion is prepared. The first and second substeps (a) and (b) are sequentially performed by using this base material. After that, the first wiring portion (on which no external connecting bump is formed) is formed on a surface which opposes the surface in which the recess is formed in the first substep. The third substep (c) is then performed to obtain the second wiring portion and form the external connecting bump. In the step of forming the second wiring portion, the planar shape of the base material of the base of the second wiring portion or the thinned base material becomes a desired shape by, e.g., etching.

The wiring board 20D shown in FIG. 4 is manufactured by the following procedures. For example, a base material of the base of the second wiring portion is prepared. Then, (i) a projection having a shape corresponding to the recess (the recess for accommodating the second wiring portion) formed in the first wiring portion, and (ii) a recess for forming a contact plug are formed. Then, the recess is filled with the conductive material to form, e.g., a resin layer around the projection and eliminate the difference between the heights of the resin layer and projection. After that, an interlayer dielectric film and wiring layer for the first wiring portion are formed on the resin layer and projection by a buildup method. This base material is thinned by etching from the other surface, thereby exposing the resin layer. Accordingly, the second wiring portion is obtained, and an external connecting bump is then formed. In this case, the resin layer functions as a portion of the first wiring portion.

The semiconductor device, the wiring board, and the manufacturing method thereof of the present invention have been explained by several embodiments, but the present invention is not limited to these embodiments. Various changes, modifications, combinations, and the like are possible.

The invention claimed is:

1. A semiconductor device characterized by comprising:
    a wiring board comprising a plurality of connecting terminals arranged on one surface in a direction of thickness and a plurality of external connecting bumps arranged on the other surface in the direction of thickness; and
    a semiconductor chip connected to said connecting terminals on said wiring board by flip chip bonding,
    wherein said wiring board comprises:
    a first wiring portion comprising a plurality of wiring layers and said external connecting bumps; and
    at least one second wiring portion integrated with said first wiring portion on said first wiring portion,
    said connecting terminals are entirely made of contact plugs formed in through holes extending through said second wiring portion in the direction of thickness,
    one end of each of said contact plugs is in direct contact with respective land portion of one of said wiring layers,
    a planar size of a surface of said second wiring portion on a side of said first wiring portion is smaller than a planar size of a surface of said first wiring portion on a side of said second wiring portion, and each connecting terminal of the second wiring portion has a smaller area than an area of each respective connecting land portion of the first wiring portion, and
    a thermal expansion coefficient of said second wiring portion is smaller than a thermal expansion coefficient of said first wiring portion and substantially equal to a thermal expansion coefficient of said semiconductor chip.

2. A semiconductor device according to claim 1, characterized in that said semiconductor chip is mounted on said second wiring portion, and
    a planar size of a surface of said second wiring portion on which said semiconductor chip is mounted is larger than a planar size of a surface of said semiconductor chip which opposes the surface of said second wiring portion.

3. A semiconductor device according to claim 2, characterized in that when viewed from above, said second wiring portion is not less than 1 mm all around larger than said semiconductor chip.

4. A semiconductor device according to claim 1, characterized in that said semiconductor chip is mounted on said second wiring portion, and
    a planar size of a surface of said second wiring portion on which said semiconductor chip is mounted is more than a size of a surface of said semiconductor chip which opposes the surface of said second wiring portion.

5. A semiconductor device according to claim 1, characterized in that said second wiring portion is buried in said first wiring portion such that the other end of each of said contact plugs is exposed.

6. A semiconductor device according to claim 1, characterized in that said semiconductor chip comprises at least one electrode terminal, and
    said electrode terminal electrically connects to individual contact plugs.

7. A semiconductor device according to claim 1, characterized in that said semiconductor chip is a silicon chip,
    said second wiring portion comprises a base made of one of silicon, ceramic, and photosensitive glass, and
    said contact plugs are formed in said base.

8. A semiconductor device according to claim 1, characterized by further comprising at least one reinforcing frame member which is bonded on said wiring board.

9. A semiconductor device according to claim 8, characterized in that a thermal expansion coefficient of said reinforcing frame member is not more than a thermal expansion coefficient of said semiconductor chip.

10. A semiconductor device according to claim 8, characterized in that said reinforcing frame member partially covers said first wiring portion and at least one second wiring portion.

11. A semiconductor device according to claim 8, characterized by further comprising a heat sink which covers said reinforcing frame member, and is in contact with said semiconductor chip.

12. A semiconductor device according to claim 1, characterized by further comprising at least one functional element formed on at least one of a surface of said second wiring portion on a side of said first wiring portion, and a surface of said first wiring portion.

13. A wiring board characterized by comprising:
a first wiring portion comprising a plurality of wiring layers and a plurality of external connecting bumps; and
at least one second wiring portion comprising a plurality of connecting terminals configured to mount a semiconductor chip by flip chip bonding,
wherein said second wiring portion is integrated with said first wiring portion on said first wiring portion,
said connecting terminals are entirely made of contact plugs formed in through holes extending through said second wiring portion in the direction of thickness,
one end of each of said contact plugs is in direct contact with respective land portion of one of said wiring layers,
a planar size of a surface of said second wiring portion on a side of said first wiring portion is smaller than a planar size of a surface of said first wiring portion on a side of said second wiring portion, and each connecting terminal of the second wiring portion has a smaller area than an area of each respective directly connecting land portion of the first wiring portion, and
a thermal expansion coefficient of said second wiring portion is smaller than a thermal expansion coefficient of said first wiring portion and substantially equal to a thermal expansion coefficient of said semiconductor chip.

14. A wiring board according to claim 13, characterized in that a planar size of a surface of said second wiring portion on which said semiconductor chip is mounted is larger than a planar size of a surface of said semiconductor chip which opposes the surface of said second wiring portion.

15. A wiring board according to claim 14, characterized in that when viewed from above, said second wiring portion is not less than 1 mm all around larger than said semiconductor chip mounted on said second wiring portion.

16. A wiring board according to claim 13, characterized in that a planar size of a surface of said second wiring portion on which said semiconductor chip is mounted is not more than a planar size of a surface of said semiconductor chip which opposes the surface of said second wiring portion.

17. A wiring board according to claim 13, characterized in that said second wiring portion is buried in said first wiring portion such that the other end of each of said contact plugs is exposed.

18. A wiring board according to claim 13, characterized in that said semiconductor chip comprises at least one electrode terminal, and
the number of said connecting terminals of said second wring portion is equal to a total sum of said electrode terminals of said semiconductor chip to be mounted on said second wiring portion.

19. A wiring board according to claim 13, characterized in that said second wiring portion comprises a base made of one of silicon, ceramic, and photosensitive glass, and
said contact plugs are formed in said base.

20. A wiring board according to claim 13, characterized by further comprising at least one reinforcing frame member which is bonded on at least a periphery of said second portion on said first wiring portion.

21. A wiring board according to claim 20, characterized in that a thermal expansion coefficient of said reinforcing frame member is not more than a thermal expansion coefficient of said semiconductor chip.

22. A wiring board according to claim 20, characterized in that said reinforcing frame member partially covers said first wiring portion and at least one second wiring portion.

23. A wiring board according to claim 13, characterized by further comprising at least one functional element formed on at least one of a surface of said second wiring portion on a side of said first wiring portion, and a surface of said first wiring portion.

* * * * *